United States Patent
Cho et al.

(10) Patent No.: US 10,128,077 B2
(45) Date of Patent: Nov. 13, 2018

(54) ELECTRON MICROSCOPE ELECTRON GUN FOR FACILITATING POSITION ADJUSTMENT AND ELECTRON MICROSCOPE INCLUDING SAME

(71) Applicant: KOREA RESEARCH INSTITUTE OF STANDARDS AND SCIENCE, Daejeon (KR)

(72) Inventors: Bok Lae Cho, Daejeon (KR); In Young Park, Daejeon (KR)

(73) Assignee: KOREA RESEARCH INSTITUTE OF STANDARDS AND SCIENCE, Daejeon (KR)

(*) Notice: Subject to any disclaimer, the term of this patent is extended or adjusted under 35 U.S.C. 154(b) by 0 days.

(21) Appl. No.: 15/576,687

(22) PCT Filed: Jan. 6, 2016

(86) PCT No.: PCT/KR2016/000076
§ 371 (c)(1),
(2) Date: Nov. 22, 2017

(87) PCT Pub. No.: WO2017/069343
PCT Pub. Date: Apr. 27, 2017

(65) Prior Publication Data
US 2018/0218874 A1    Aug. 2, 2018

(30) Foreign Application Priority Data

Oct. 20, 2015 (KR) .................. 10-2015-0145944
Dec. 1, 2015 (KR) .................. 10-2015-0169681

(51) Int. Cl.
*H01J 37/06*    (2006.01)
*H01J 37/065*    (2006.01)
*H01J 37/26*    (2006.01)

(52) U.S. Cl.
CPC ............ *H01J 37/065* (2013.01); *H01J 37/06* (2013.01); *H01J 37/26* (2013.01); *H01J 2237/061* (2013.01); *H01J 2237/06341* (2013.01)

(58) Field of Classification Search
CPC ........ H01J 37/06; H01J 37/063; H01J 37/065; H01J 37/067; H01J 37/26; H01J 2237/061; H01J 2237/06341
See application file for complete search history.

(56) References Cited

U.S. PATENT DOCUMENTS

| | | | |
|---|---|---|---|
| 4,663,325 A * | 5/1987 | Ohtaka | C07D 295/096 514/255.04 |
| 4,663,525 A | 5/1987 | Ohtsuki et al. | |
| 5,684,364 A | 11/1997 | Heppinstall et al. | |

FOREIGN PATENT DOCUMENTS

| | | | |
|---|---|---|---|
| JP | 2000-28800 A | | 1/2000 |
| JP | 2000028800 A | * | 1/2000 |

(Continued)

OTHER PUBLICATIONS

International Search Report dated Jul. 26, 2016 of PCT/KR2016/000076 which is the parent application and its English translation—4 pages.

*Primary Examiner* — David E Smith
(74) *Attorney, Agent, or Firm* — Knobbe Martens Olson & Bear LLP

(57) ABSTRACT

The present invention relates to an electron gun for facilitating position adjustment, and an electron microscope including the same, the electron gun improving a vacuum structure so as to easily move a filament block or an electron tip of an electron gun without having bellows for maintaining a vacuum when the center axis of the filament block or (Continued)

the electron tip of the electron gun is mechanically misaligned with the center axis of a anode and a focusing lens.

12 Claims, 3 Drawing Sheets

(56) References Cited

FOREIGN PATENT DOCUMENTS

| | | | |
|---|---|---|---|
| JP | 2000-195454 | A | 7/2000 |
| JP | 2004-327410 | A | 11/2004 |
| JP | 2009-38170 | A | 2/2009 |
| JP | 2011-138670 | A | 7/2011 |
| KR | 10-0473691 | B1 | 4/2005 |
| KR | 10-1156124 | B1 | 7/2012 |
| KR | 101156124 | B1 * | 7/2012 |

\* cited by examiner

ELECTRON MICROSCOPE ELECTRON GUN FOR FACILITATING POSITION ADJUSTMENT AND ELECTRON MICROSCOPE INCLUDING SAME

TECHNICAL FIELD

The present invention relates to an electron microscope and an electron gun, and more particularly, to an electron gun for facilitating position adjustment, which includes an enhanced vacuum structure capable of moving a filament block or electron tip of the electron gun without a metallic bellows for maintaining a vacuum, when the center axis of the filament block or the electron tip of the electron gun is mechanically misaligned from the center axes of an anode and a focusing lens, and thus facilitates an assembling or disassembling operation, and an electron microscope including the same.

BACKGROUND ART

The scanning electron microscope (SEM) scans a sample with an electron beam in a two-dimensional manner, detects a secondary electron emitted from the sample, and creates an image using the detected electron. The SEM has a similar configuration to an optical microscope that includes an object lens and creates an image using light reflected from the surface of a sample. An electron gun corresponding to a light source of the optical microscope serves to generate an electron and accelerate the electron. The electron gun supplies a group of electrons, which is used in the form of an electron beam.

Since an electron in an atom has constant energy at a specific energy orbit through an electric force acting between the electron and the nucleus of the atom, the electron hardly escapes from the atom as long as energy is not applied from outside. However, when energy equal to or more than an energy barrier (work function) is applied, the electron escapes to the outside. That is, when a metal used as a filament of an electron gun, such as tungsten, is heated at high temperature, electrons bound to the atom escape from the nucleus to the vacuum.

The electron gun for an electron microscope may be divided into a thermionic electron gun and a field emission electron gun, depending on their electron emission methods. A filament used as a cathode in the thermionic electron gun is usually formed of tungsten wire, bent in a hair pin shape having a V-shaped end, and has a diameter of approximately 100 μm. Since tungsten has a low work function value of 4.5 eV and a high melting point of 3,659K, tungsten is used as the filament in many cases. The thermionic electron gun directly applies a current to the filament until the temperature rises to about 2,200K. In a high-quality electron microscope, a filament formed of $LaB_6$ (lanthanum hexaboride) is used to increase electron density, and heated to a temperature of 1,800K. When atoms are adsorbed to the surface of LaB6, electron emission performance is significantly degraded. Thus, a high vacuum must be maintained in the electron microscope.

The thermionic electron gun includes a filament at the top thereof and an anode plate at the bottom thereof. The filament is surrounded by a Wehnelt cylinder, and the anode plate serves as an acceleration electrode. In the Wehnelt cylinder, a voltage having a smaller negative value than the filament used as a cathode is formed as a bias voltage. Thus, electrons emitted from the filament are focused in the center by a repulsive force. The thermionic electron gun accelerates the electrons through a voltage difference applied between the anode plate and the filament serving as the cathode, and emits the accelerated electrons emitted from the filament downward, thereby forming an electron beam.

The field emission electron gun includes a tip serving as a cathode and primary and secondary anodes. The tip is made of tungsten, and manufactured in a sharp shape to have a curvature radius of approximately 600 to 2,000 A. Thus, when a strong electric field is applied, the tip reduces the thickness of a potential barrier such that electrons can easily escape from the surface of tungsten through the tunneling effects. Since the field emission electron gun acquires an electron beam with uniform energy from the tip, the field emission electron gun can form ultra-high electron beam brightness and a small intersection, thereby acquiring high resolution. The primary anode applies a high voltage of several kV such that electrons are emitted from the tip, and the secondary anode accelerates the electrons. At this time, an acceleration voltage of several tens of kV is applied between the secondary anode and the tip. The field emission electron gun may be divided into a cold cathode field emitter (CFE), a thermally assisted field emitter (TFE) and a Schottky field emitter (SE).

The center axis of an electron beam emitted from a filament block including the filament and the Wehnelt cylinder in the thermionic electron gun or an electron beam emission unit including the tip and the primary anode in the field emission electron gun must be aligned with the center axes of a focusing lens and the anode plate of the thermionic electron gun or the secondary anode of the field emission electron gun. When the center axes are misaligned from each other, a problem may occur in electron beam alignment, and the number of electrons reaching a sample may decrease. In this case, an aberration may occur in an electromagnetic field lens, and the sample examination resolution may be degraded. Furthermore, in the related art, a metal gasket has been used for vacuum sealing, which means that a new metal gasket must be used during a disassembling/assembling operation. Thus, the operation takes a lot of cost, and a metal bellows requires a high manufacturing cost. In order to perform sealing using a metal gasket, an operator must apply a predetermined force, and may have inconvenience in the disassembling/assembling operation because a number of assembling screws are need.

U.S. Pat. No. 4,663,525 discloses a method for electron gun alignment in electron microscopes. In this method, however, when a tip position is mechanically adjusted, a bellows is inserted into an electron gun in order to maintain a filament connection portion in a vacuum state. Thus, the structure of the electron gun becomes complex.

The electron gun must maintain a vacuum state therein such that a flow of electron beam does not collide with internal gas. The thermionic electron gun requires a high vacuum of $10^{-3}$ Pa to $10^{-5}$ Pa, and the field emission electron gun emitting a high-density (high brightness) electron beam required for a high-resolution electron microscope is operated at a vacuum of approximately $10^{-6}$ Pa or less, which is much higher than the thermionic electron gun. In particular, the cold field emission electron gun among the field emission electron guns requires a vacuum of $10^{-7}$ Pa or less. Therefore, a container for maintaining an ultra high vacuum of the field emission electron guns for emitting a high-density electron beam is usually formed of stainless steel (STS) suitable for maintaining a high vacuum, because STS has a relatively low outgassing rate.

In order to prevent a disturbance of electron flow, a stray magnetic field must be blocked while a high vacuum is maintained, the stray magnetic field permeating from the outside of the electron gun. This is because, since electrons are charged particles and have a small mass, the electrons are sensitive to a magnetic field. In order to shield a magnetic field, a material with high permeability needs to be used, but STS has a small relative permeability ($\mu_r$) of 1 to 10. Therefore, in the related art, an electron beam emission source is surrounded by Mu-metal with a relative permeability of 20,000 to 50,000 or permalloy with a relative permeability of 8,000, in order to shield a magnetic field. However, the permalloy or Mu-metal is expensive and requires a high processing cost. Thus, when a material having a low outgassing rate and high relative permeability is used to maintain a high vacuum, economical efficiency and manufacturing facilitation can be secured.

Korean Registration Patent 10-0473691 discloses an aluminum (Al or Al alloy)-based vacuum chamber member. However, this patent relates to a material which exhibits a high corrosion resistance to corrosive gas or plasma. Thus, the material is very different from a material for forming a vacuum chamber which is capable of preventing a stray magnetic field while maintaining a high vacuum.

DISCLOSURE

Technical Problem

The present invention is intended to provide an electron gun which includes an enhanced vacuum holding seal to align the center axis of an electron beam with the center axes of an anode plate or secondary anode and a focusing lens without installing a complex structure such as a bellows in the electron gun, and includes a chamber formed of a material capable of maintaining an ultra high vacuum and shielding a stray magnetic field to stabilize the movement of an electron beam, without installing a separate shielding structure for preventing an introduction of a stray magnetic field into the electron gun, and an electron microscope including the same.

Technical Solution

In order to solve the problem, the present inventors have discovered that a double O-ring or magnetic fluid seal can be used to seal a space between an electron beam generation chamber and a top flat plate having an electron beam generator, and the top flat plate can be moved to easily and economically align an electron beam.

In one aspect, the present invention provides an electron-microscope electron gun for facilitating position adjustment, including: a tube-shaped side portion having a first vacuum exhaust pipe; a plate-shaped top portion being in contact with the top edge surface of the tube-shaped side portion with a double O-ring interposed therebetween, and having an electron beam generation unit installed in the center thereof, the electron beam generation unit facing the inside of a tube-shaped space; a first bottom portion serving as an internal flat plate being in contact with the bottom surface of the tube-shaped side portion, and having an electron beam passing hole formed at a position facing an electron emission direction of the electron beam generation unit; a tube-shaped side extension portion extended past the contact position between the tube-shaped side portion and the first bottom portion, and having a second vacuum exhaust pipe; and a second bottom portion serving as an internal flat plate being in contact with the bottom surface of the tube-shaped side extension portion, and having an electron beam passing hole formed at a position facing the electron beam passing hole of the first bottom portion. The tube-shaped side portion, the plate-shaped top portion and the first bottom portion may form a first vacuum chamber. The first bottom portion, the tube-shaped side extension portion and the second bottom portion may form a second vacuum chamber. The double O-ring may include a first O-ring being in contact with the inside of the top edge surface and a second O-ring being in contact with the outside of the top edge surface, and a plurality of third vacuum exhaust pipes may be installed to connect a space between the first and second O-rings.

In another aspect, the present invention provides an electron-microscope electron gun for facilitating position adjustment, including: a tube-shaped side portion having a first vacuum exhaust pipe and a magnetic field generation unit installed at a top edge surface thereof; a plate-shaped top portion being in contact with the top edge surface of the tube-shaped side portion with a ring-shaped magnetic fluid seal interposed therebetween, and having an electron beam generation unit installed in the center thereof, the electron beam generation unit facing the inside of a tube-shaped space; a first bottom portion serving as an internal flat plate being in contact with the bottom surface of the tube-shaped side portion, and having an electron beam passing hole formed at a position facing an electron emission direction of the electron beam generation unit; a tube-shaped side extension portion extended past the contact position between the tube-shaped side portion and the first bottom portion, and having a second vacuum exhaust pipe; and a second bottom portion serving as an internal flat plate being in contact with the bottom surface of the tube-shaped side extension portion, and having an electron beam passing hole formed at a position facing the electron beam passing hole of the first bottom portion. The tube-shaped side portion, the plate-shaped top portion and the first bottom portion may form a first vacuum chamber, and the first bottom portion, the tube-shaped side extension portion and the second bottom portion may form a second vacuum chamber.

In one embodiment, the plurality of third vacuum exhaust pipes may be connected to the second vacuum chamber.

In another embodiment, the plate-shaped top portion may further include a knob for horizontal movement.

In still another embodiment, the electron beam generation unit may include a field emission electron source, the tube-shaped side portion, the plate-shaped top portion and the tube-shaped side extension portion may be formed of soft steel having a carbon weight fraction of 0.2% or less, and the soft steel may have a nickel or chrome anti-oxidation layer formed on the surface thereof, in order to prevent oxidation or corrosion.

In yet another embodiment, the first and second vacuum chambers may have different vacuum degrees.

In still yet another embodiment, the magnetic field generation unit may include a permanent magnet.

In still another aspect, the present invention also provides an electron microscope including the electron gun.

Advantageous Effects

According to the embodiments of the present invention, the electron gun for facilitating position adjustment can move the plate-shaped top portion on the double O-ring or the magnetic fluid seal without a bellows surrounding and sealing the electron beam generator, in order to align the center axis of an electron beam with an anode plate or field emission electron source facing a Wehnelt cylinder and a secondary anode arranged in parallel to a primary anode. Therefore, the electron beam can be easily adjusted, and the structure can be simplified in comparison to when a bellows is used. Furthermore, the assembling and disassembling operation can be facilitated, and the reusable rubber ring is used. Moreover, soft steel which can maintain an ultra-high vacuum at a similar level to stainless steel and has a large relative permeability is used as the material of the chamber in order to prevent an introduction of a stray magnetic field without an additional structure such as Mu-metal or permalloy surrounding the electron beam generator. Therefore, the electron gun can be manufactured through a simple process, and does not need to employ a complex structure.

MODE FOR INVENTION

Hereinafter, preferred embodiments of the present invention will be described in detail with reference to the accompanying drawings such that the present invention can easily be embodied by a person with ordinary skill in the art to which the invention pertains. Before the present invention is described in detail, the terms or words used in this specification and claims should not be limited to typical definitions or dictionary definitions. Therefore, the configurations described in this specification and the drawings are only preferred embodiments of the present invention, and do not fully represent the technical idea of the present invention. Thus, various equivalents and modifications capable of replacing the embodiments may be provided at the point of time that the present application is filed.

Figure 1:
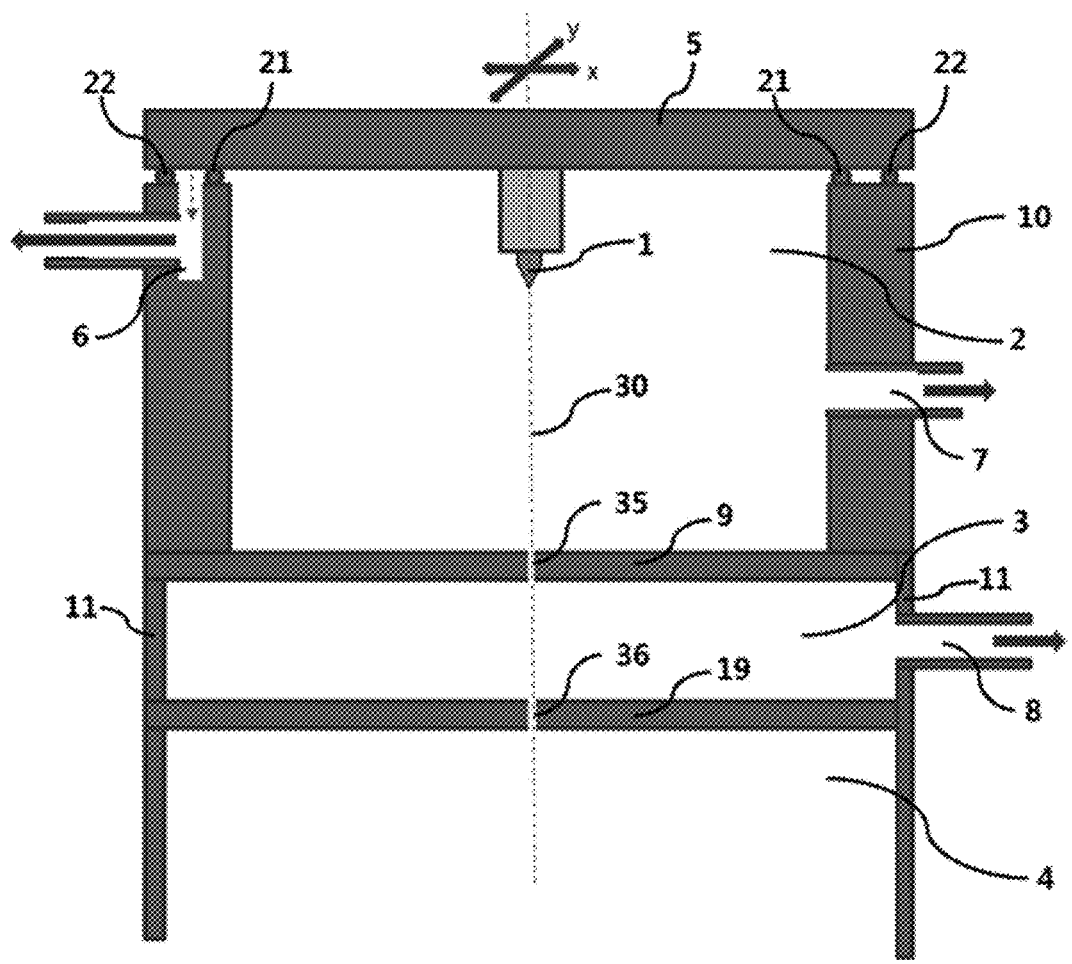
FIG. 1 is a conceptual view illustrating an electron gun which maintains a vacuum with a double O-ring between the top edge surface of a tube-shaped side portion and a plate-shaped top portion according to an embodiment of the present invention.

FIG. 1 is a conceptual view illustrating an electron gun for maintaining a vacuum with a double O-ring between the top edge surface of a tube-shaped side portion and a plate-shaped top portion according to an embodiment of the present invention. The electron-microscope electron gun for facilitating position adjustment according to the embodiment of the present invention includes a tube-shaped side portion 10, a plate-shaped top portion 5, a first bottom portion 9, a tube-shaped side extension portion 11 and a second bottom portion 19. The tube-shaped side portion 10 has a first vacuum exhaust pipe 7 installed therein. The plate-shaped top portion 5 is in contact with the top edge surface of the tube-shaped side portion with a double O-ring 21 and 22 interposed therebetween. The first bottom portion 9 is an internal flat plate being in contact with the bottom surface of the tube-shaped side portion, and has an electron beam passing hole 35 formed at a position facing the electron emission direction of an electron beam generator.

The tube-shaped side extension portion 11 is extended past the position at which the tube-shaped side portion 10 is in contact with the first bottom portion 9, and has a second vacuum exhaust pipe 8 installed therein. The second bottom portion 19 is an internal flat plate being in contact with the bottom surface of the tube-shaped side extension portion 11, and has an electron beam passing hole 36 formed at a position facing the electron beam passing hole of the first bottom portion.

Figure 2:
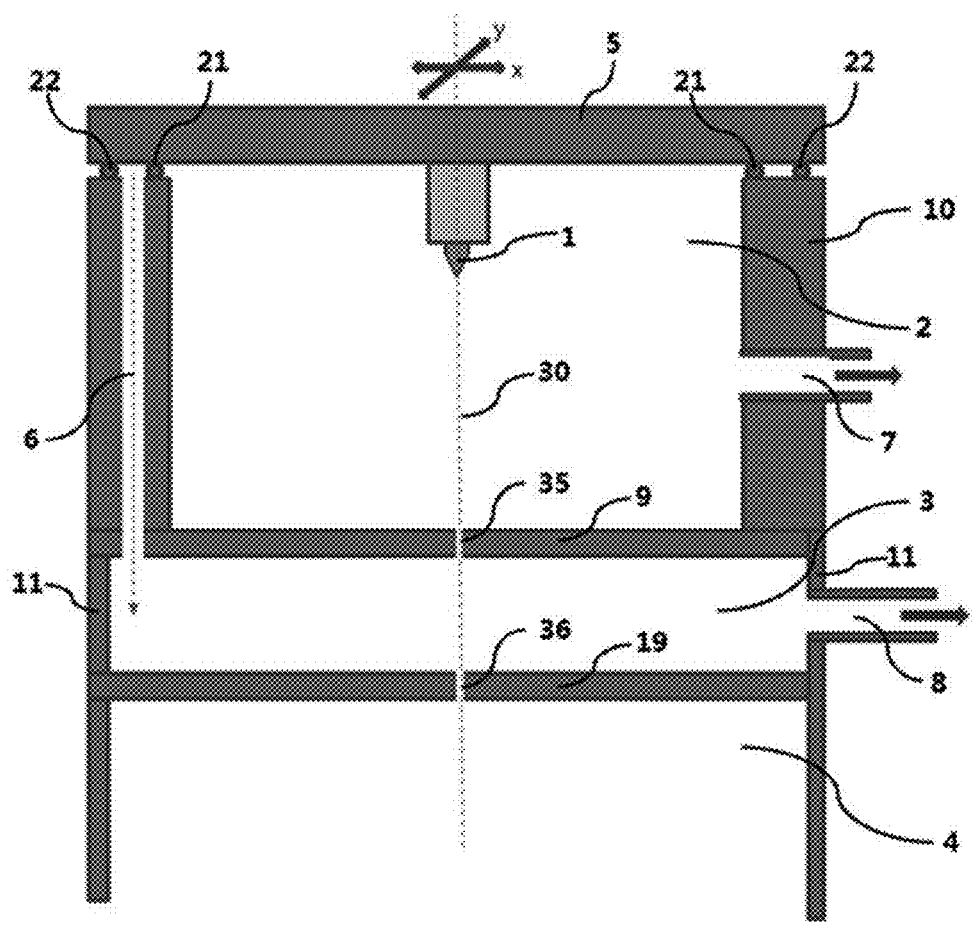
FIG. 2 is a conceptual view illustrating an electron gun which maintains a vacuum with a double O-ring between the top surface of a tube-shaped side portion and a plate-shaped top portion and has a structure in which first and second spaces is connected through a third vacuum exhaust pipe, according to an embodiment of the present invention.

In an embodiment of the present invention, the tube-shaped side portion 10, the plate-shaped top portion 5 and the first bottom portion 9 form a first vacuum chamber 2, and the first bottom portion 9, the tube-shaped side extension portion 11 and the second bottom portion 19 form a second vacuum chamber 3. The double O-ring includes a first ring 21 being in contact with the inside of the top edge surface of the tube-shaped side portion 10 and a second ring 22 being in contact with the outside of the top edge surface of the tube-shaped side portion 10, and a plurality of third vacuum exhaust pipes 6 are connected to a space between the first and second O-rings. The third vacuum exhaust pipes 6 may be directly vacuum-exhausted through a vacuum pump or used in connection with a vacuum exhaust pump of a sample chamber. As illustrated in FIG. 2, the plurality of third vacuum exhaust pipes may be connected to the second vacuum chamber and vacuum-exhausted through the second vacuum exhaust pipe in the second vacuum chamber.

In an embodiment of the present invention, an electron-microscope electron source requiring an ultra high vacuum may be used as an electron source located in the first vacuum chamber 2. The microscope electron source may include a cold field emission electron source, a photoelectron emission electron source, and a field emission electron source (thermal field emission electron source) as a Schottky electron source. When the electron source requiring an ultra high vacuum is used, the vacuum of the first vacuum chamber through the first vacuum exhaust pipe has lower pressure than the vacuum of the second vacuum chamber through the second vacuum exhaust pipe.

Electrons emitted from the electron source form an electron beam 30, and the electron beam 30 sequentially passes through the electron beam passing hole 35 of the first bottom portion 9 and the electron beam passing hole 36 of the second bottom portion 19, and then propagates to an electron beam control column 4. At this time, the position of the plate-shaped top portion 5 is adjusted in the plane direction (x or y direction) in order to align the electron beam. Even while the plate-shaped top portion 5 is moved for position adjustment, a vacuum is maintained through the double O-ring 21 and 22. Thus, a separate device such as a bellows for maintaining the vacuum of the electron source does not need to be installed in the first vacuum chamber 2. Furthermore, the use of the O-ring does not require a large mechanical force to move the plate-shaped top portion 5 in the plane direction while the vacuum is maintained. In an embodiment of the present invention, a knob for horizontal movement may be installed in order to precisely move the plate-shaped top portion 5 in the plane direction. In an embodiment of the present invention, the electron gun may include a measurement device capable of measuring an electron beam current at a sample position depending on the alignment of the electron beam. The measurement device may include any measurement devices as long as they can be used for the electron microscope technology.

Figure 3:
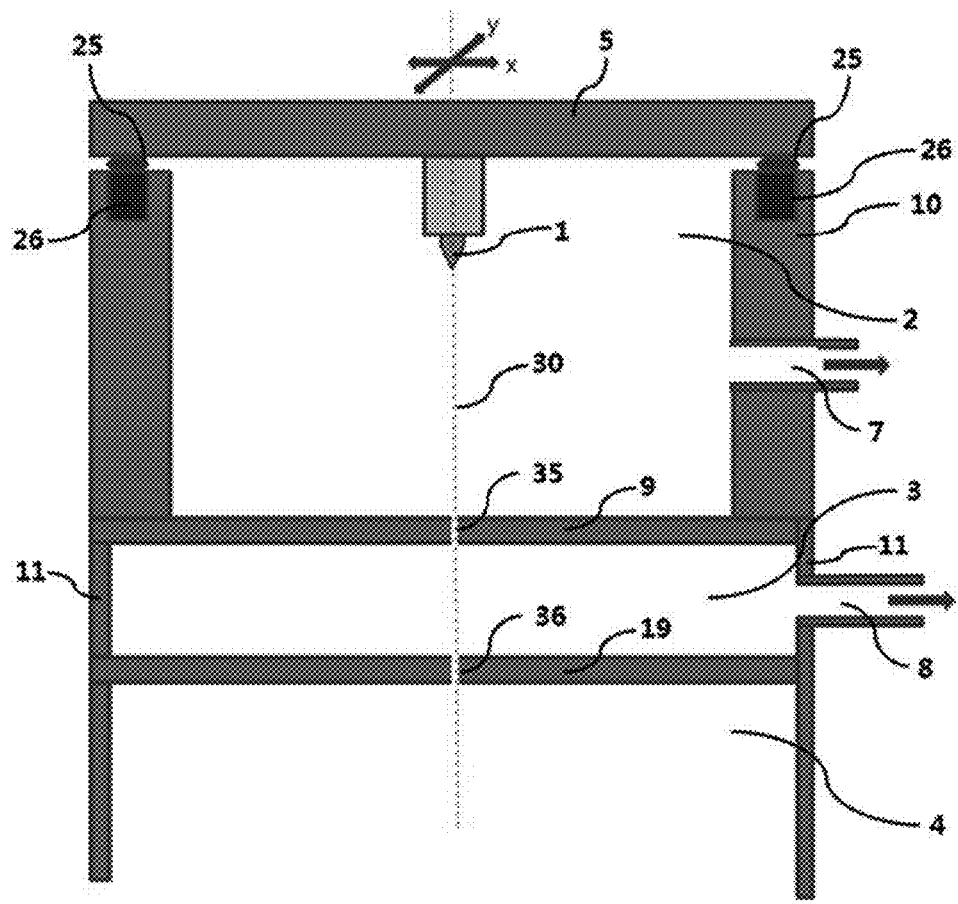
FIG. 3 is a conceptual view illustrating an electron gun which maintains a vacuum with a magnetic fluid seal between the top surface of a tube-shaped side portion and a plate-shaped top portion according to an embodiment of the present invention.

FIG. 3 is a conceptual view illustrating an electron gun which maintains a vacuum with a magnetic fluid sealing part between the top edge surface of a tube-shaped side portion and a plate-shaped top portion according to an embodiment of the present invention. The electron-microscope electron gun for facilitating position adjustment according to the embodiment of the present invention includes a tube-shaped side portion 10, a plate-shaped top portion 5, a first bottom portion 9, a tube-shaped side extension portion 11 and a second bottom portion 19. The tube-shaped side portion 10 includes a first vacuum exhaust pipe 7 and a magnetic field generation unit 26 formed on the top edge surface thereof. The plate-shaped top portion 5 is in contact with the top edge surface of the tube-shaped side portion 10 with a ring-shaped magnetic fluid seal 25 interposed therebetween, and includes an electron beam generator installed in the center thereof, the electron beam generator facing the inside of the tube-shaped space. The first bottom portion 9 is an internal plate which is in contact with the bottom edge surface of the tube-shaped side portion, and has an electron beam passing hole 35 formed at a position facing an electron emission direction of the electron beam generator. The tube-shaped side extension portion 11 is extended past the contact position between the tube-shaped side portion and the first bottom portion 9, and includes a second vacuum exhaust pipe 8 installed therein. The second bottom portion 19 is an internal flat plate being in contact with the bottom edge surface of the tube-shaped side extension portion, and has an electron beam passing hole 36 formed at a position facing the electron beam passing hole 35 of the first bottom portion 9.

In an embodiment of the present invention, the tube-shaped side portion 10, the plate-shaped top portion 5 and the first bottom portion 9 form a first vacuum chamber 2, and the first bottom portion 9, the tube-shaped side extension portion 11 and the second bottom portion 19 form a second vacuum chamber 3.

In an embodiment of the present invention, the electron beam generator is a field emission electron source requiring an ultra high vacuum, the tube-shaped side portion, the plate-shaped top portion and the tube-shaped side extension portion in the electron gun having the field emission electron source are made of soft steel having a carbon weight fraction of 0.2% or less, and the soft steel has a nickel or chrome anti-oxidation layer formed thereon in order to prevent oxidation or corrosion.

Steel refers to iron having a carbon content of 2% or less, carbon steel refers to steel in which only carbon is used as an alloy element, and special steel or alloy steel refers to steel obtained by adding another alloy element to carbon steel. In this specification, 'soft steel' is defined as low-carbon steel to which an alloy element is not added. The mechanical properties of the carbon steel are significantly changed depending on the amount of carbon contained therein. Therefore, the carbon steel is divided into soft steel or low-carbon steel having a carbon content of 0.25% or less, mid-carbon steel having a carbon content of 0.25 to 0.60%, and high-carbon steel having a carbon content of 0.60%. The low-carbon steel having a tensile strength of 5 MPa or less exhibits favorable formability. Therefore, the low-carbon steel is used for a steel plate, a rivet and the like, which do not require high strength. The alloy steel refers to steel to which a suitable amount of different metal is added in order to give a specific property to carbon steel. Representative examples of the alloy steel may include stainless steel. The alloy steel may contain nickel or chrome, have a small amount of carbon, and exhibit excellent corrosion resistance. The stainless steel has an excellent mechanical property. Specifically, even when the stainless steel having a thickness corresponding to ⅓ of an aluminum plate is used, the stainless steel exhibits the same strength. Furthermore, the stainless steel has high electric resistance and low heat conductivity. Since the stainless steel has a low outgassing rate ($10^{-8}$ Pa m$^3$ s$^{-1}$ m$^{-2}$ after vacuum exhaust for 10 hours or $10^{-9}$ Pa m$^3$ s$^{-1}$ m$^{-2}$ after heat treatment at a temperature of 100 to 200° C.), the stainless steel is mainly used as the material of an ultra high vacuum chamber. However, since the stainless steel has a low relative permeability ($\mu_r$) of 1 to 10 which is not suitable for being used as the material of a chamber for an electron gun, Mu-metal having a large relative permeability of 20,000 to 50,000 or permalloy having a relative permeability of 8,000 is separately used to shield a magnetic field.

Since the soft steel has a relative permeability of 100 to 5,000, the soft steel is widely used for shielding a stray magnetic field. However, the soft steel exhibits an outgassing rate of $10^{-5}$ to $10^{-6}$ Pa m$^3$ s$^{-1}$ m$^{-2}$ after vacuum exhaust for 10 hour, which is 100 to 1000 times higher than the outgassing rate of the stainless steel. Thus, there has been some doubt about the use of the soft steel as the material an ultra high vacuum chamber. Therefore, the soft steel is generally used as the material of a sample chamber having a low vacuum degree. According to a related document, the outgassing rates of soft steel and chrome-plate soft steel after a heat treatment at 300° C. are $2.6 \times 10^{-8}$ Pa m$^3$ s$^{-1}$ m$^{-2}$ and $8 \times 10^{-9}$ Pa m$^3$ s$^{-1}$ m$^{-2}$, respectively (Y. Ishimori, N. Yoshimura, S. Hasegawa and H. Oikawa, J. Vac. Soc. Jpn. 14, 295 (1971)). In an embodiment of the present invention, the ultra high vacuum chamber of the electron gun, which is made of soft steel, is used to constitute the electron microscope without a separate shield device using Mu-metal or permalloy.

In an embodiment of the present invention, the soft steel may have a nickel or chrome anti-oxidation layer formed thereon in order to prevent oxidation or corrosion. Since the soft steel has a low outgassing rate, the plating is not aimed for improving vacuum performance, but aimed for preventing oxidation or corrosion of the surface.

In an embodiment of the present invention, the ultra high vacuum pump is an ion pump, and the vacuum exhaust pipe of the first vacuum chamber may additionally include a non evaporable getter pump (NEG). The NEG may temporarily drop the vacuum degree the moment that the NEG is activated, but can improve the vacuum degree.

The magnetic fluid is a liquid material responding to a magnet, which has been developed as "method for transferring liquid fuel of a space ship in a weightless state of the space" by the space program of NASA in the early of 1960s. The magnetic fluid is composed of magnetic particles (oxidized steel) having a diameter of 10 nm, a surface active agent adsorbed onto the surfaces of the magnetic particles and a disperse medium (base liquid). When the surface active agent is adsorbed onto the surfaces of the particles, the particles in the disperse medium are not condensed but stably maintained in a colloidal state. Depending on the use of the disperse medium and the environment in which the disperse medium is to be used, water, ethers, esters or discord carbons may be used as the disperse medium of the magnetic fluid.

When no magnetic field is applied, the magnetic fluid is simple liquid with no magnetic property. However, when a magnetic field is applied from outside, the magnetic fluid is magnetized. Then, when the magnetic field is removed, the magnetic property of the magnetic fluid disappears. That is, since the magnetic fluid has no remanence, the magnetic fluid has no hysteresis characteristic. Such a property is referred to as superparamagnetism. The magnetization of the magnetic fluid is proportional to the amount of magnetic particles contained in the magnetic fluid per unit volume, and saturated at a saturation magnetization value. In order to prevent a leakage of liquid or gas using the magnetic fluid, a magnetic fluid seal may be used. The strength at which the magnetic fluid is maintained is decided by a magnetic force, and friction between two solids with the magnetic fluid interposed therebetween does not generate particles. Furthermore, the magnetic fluid can be used for an ultra high vacuum region, and has a long lifetime.

Electrons emitted from the electron source form an electron beam 30, and the electron beam 30 sequentially passes through the electron beam passing hole 35 of the first bottom portion 9 and the electron beam passing hole 36 of the second bottom portion 19, and then propagates to an electron beam control column 4. At this time, the position of the plate-shaped top portion 5 is adjusted in the plane direction (x and y direction) in order to align the electron beam. Even while the plate-shaped top portion 5 is moved for position adjustment, a vacuum is maintained through the magnetic fluid seal 25 and the magnetic field generation unit 26. Thus, a separate device such as a bellows for maintaining the vacuum of the electron source does not need to be installed in the first vacuum chamber 2. Furthermore, the use of the magnetic fluid seal 25 does not require a large mechanical force to move the plate-shaped top portion 5 in the plane direction while the vacuum is maintained. In an embodiment of the present invention, a knob for horizontal movement may be installed in order to precisely move the plate-shaped top portion 5 in the plane direction. In an embodiment of the present invention, the magnetic field generation unit may include an electromagnet or permanent magnet, and have a function of shielding a magnetic field from having an influence on the electron beam path. In an embodiment of the present invention, the electron gun may include a measurement device capable of measuring an electron beam current at a sample position depending on the alignment of the electron beam. The measurement device may include any measurement devices as long as they can be used for the electron microscope technology.

In an embodiment of the present invention, the electron gun is employed as an electron gun of an electron microscope, and the electron microscope includes the electron gun, the electron gun control column and a sample chamber. An electron beam generated by the electron gun passes through the electron beam passing hole 36 of the second bottom portion 19 and then propagates to the electron beam control column, and the electron beam focused by the electron beam control column is incident on the sample chamber to generate secondary electrons and backscattered electrons. Then, an electron microscope image is acquired through the secondary electrons and backscattered electrons.

While the present invention has been particularly shown and described with reference to preferred embodiments thereof, it will be understood by those skilled in the art that various changes in form and details may be made therein without departing from the spirit and scope of the invention as defined by the appended claims.

All technical terms used in this specification are used as meanings which are generally understood by those skilled in the art to which the present invention pertains, as long as they are not defined as different meanings. The contents of all publications described as cited documents in this specification are introduced into the present invention.

The invention claimed is:

1. An electron-microscope electron gun for facilitating position adjustment, comprising:
 a tube-shaped side portion having a first vacuum exhaust pipe;
 a plate-shaped top portion being in contact with the top edge surface of the tube-shaped side portion with a double O-ring interposed therebetween, and having an electron beam generator installed in the center thereof, the electron beam generator facing the inside of a tube-shaped space;
 a first bottom portion serving as an internal flat plate being in contact with the bottom surface of the tube-shaped side portion, and having an electron beam passing hole formed at a position facing an electron emission direction of the electron beam generator;
 a tube-shaped side extension portion extended past the contact position between the tube-shaped side portion and the first bottom portion, and having a second vacuum exhaust pipe; and
 a second bottom portion serving as an internal flat plate being in contact with the bottom surface of the tube-shaped side extension portion, and having an electron beam passing hole formed at a position facing the electron beam passing hole of the first bottom portion,
 wherein the tube-shaped side portion, the plate-shaped top portion and the first bottom portion form a first vacuum chamber,
 the first bottom portion, the tube-shaped side extension portion and the second bottom portion form a second vacuum chamber, and
 the double O-ring includes a first O-ring being in contact with the inside of the top edge surface and a second O-ring being in contact with the outside of the top edge surface, and a plurality of third vacuum exhaust pipes are installed to connect a space between the first and second O-rings.

2. An electron-microscope electron gun for facilitating position adjustment, comprising:
 a tube-shaped side portion having a first vacuum exhaust pipe and a magnetic field generation unit installed at a top edge surface thereof;
 a plate-shaped top portion being in contact with the top edge surface of the tube-shaped side portion with a ring-shaped magnetic fluid seal interposed therebetween, and having an electron beam generator installed in the center thereof, the electron beam generator facing the inside of a tube-shaped space;
 a first bottom portion serving as an internal flat plate being in contact with the bottom surface of the tube-shaped side portion, and having an electron beam passing hole formed at a position facing an electron emission direction of the electron beam generator;
 a tube-shaped side extension portion extended past the contact position between the tube-shaped side portion and the first bottom portion, and having a second vacuum exhaust pipe; and
 a second bottom portion serving as an internal flat plate being in contact with the bottom surface of the tube-shaped side extension portion, and having an electron beam passing hole formed at a position facing the electron beam passing hole of the first bottom portion,
 wherein the tube-shaped side portion, the plate-shaped top portion and the first bottom portion form a first vacuum chamber, and
 the first bottom portion, the tube-shaped side extension portion and the second bottom portion form a second vacuum chamber.

3. The electron-microscope electron gun of claim 1, wherein the plurality of third vacuum exhaust pipes are connected to the second vacuum chamber.

4. The electron-microscope electron gun of claim 1, wherein the plate-shaped top portion further comprises a knob for horizontal movement.

5. The electron-microscope electron gun of claim 1, wherein the electron beam generator comprises a field emission electron source,
the tube-shaped side portion, the plate-shaped top portion and the tube-shaped side extension portion are formed of soft steel having a carbon weight fraction of 0.2% or less, and
the soft steel has a nickel or chrome anti-oxidation layer formed on the surface thereof, in order to prevent oxidation or corrosion.

6. The electron-microscope electron gun of claim 1, wherein the first and second vacuum chambers have different vacuum degrees.

7. The electron-microscope electron gun of claim 2, wherein the magnetic field generation unit comprises a permanent magnet.

8. An electron microscope comprising the electron gun of claim 1.

9. The electron-microscope electron gun of claim 2, wherein the plate-shaped top portion further comprises a knob for horizontal movement.

10. The electron-microscope electron gun of claim 2, wherein the electron beam generator comprises a field emission electron source,
the tube-shaped side portion, the plate-shaped top portion and the tube-shaped side extension portion are formed of soft steel having a carbon weight fraction of 0.2% or less, and
the soft steel has a nickel or chrome anti-oxidation layer formed on the surface thereof, in order to prevent oxidation or corrosion.

11. The electron-microscope electron gun of claim 2, wherein the first and second vacuum chambers have different vacuum degrees.

12. An electron microscope comprising the electron gun of claim 2.

* * * * *